United States Patent
Takizawa

[19]

[11] Patent Number: 6,167,539
[45] Date of Patent: *Dec. 26, 2000

[54] TRANSMITTING APPARATUS WITH CODE FORMATION BASED ON DETECTED TRANSMISSION CHANNEL DATA

[75] Inventor: Hiroshi Takizawa, Yokohama, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 07/974,700

[22] Filed: Nov. 12, 1992

[30] Foreign Application Priority Data

Nov. 14, 1991 [JP] Japan .................................. 3-298934
Jun. 18, 1992 [JP] Japan .................................. 4-159763

[51] Int. Cl.[7] ...................................................... H04M 1/14
[52] U.S. Cl. ............................................................ 714/708
[58] Field of Search ................................. 371/5.1, 5.5, 41,
371/20.1, 20.2, 20.5; 358/133, 135, 430,
426, 261.2, 405; 370/17; 375/8, 60, 296,
225; 455/89; 348/466, 473, 474, 405; 714/708

[56] References Cited

U.S. PATENT DOCUMENTS

| | | | |
|---|---|---|---|
| 4,047,151 | 9/1977 | Rydbeck et al. | 371/41 |
| 4,153,916 | 5/1979 | Miwa et al. | 358/406 |
| 4,580,162 | 4/1986 | Mori | 358/135 |
| 4,656,523 | 4/1987 | Mizutani | 358/260 |
| 4,731,800 | 3/1988 | Motley et al. | 375/58 |
| 4,939,731 | 7/1990 | Reed et al. | 371/32 |
| 4,972,439 | 11/1990 | Kuznicki et al. | 375/60 |
| 5,007,047 | 4/1991 | Sridhar et al. | 370/32.1 |
| 5,008,903 | 4/1991 | Betts et al. | 375/60 |
| 5,038,366 | 8/1991 | Motley et al. | 375/39 |
| 5,048,054 | 9/1991 | Eyuboglu et al. | 375/8 |
| 5,128,942 | 7/1992 | Kojima | 371/5.5 |
| 5,159,447 | 10/1992 | Haskell et al. | 358/133 |
| 5,202,770 | 4/1993 | Murakami et al. | 358/426 |
| 5,233,348 | 8/1993 | Pollmann et al. | 341/67 |
| 5,233,629 | 8/1993 | Paik et al. | 375/39 |
| 5,241,382 | 8/1993 | Paik et al. | 358/133 |
| 5,251,328 | 10/1993 | Shaw | 455/73 |
| 5,283,656 | 2/1994 | Sugahara | 358/261.1 |
| 5,321,725 | 6/1994 | Paik et al. | 375/39 |

*Primary Examiner*—Stephen M. Baker
*Attorney, Agent, or Firm*—Fitzpatrick, Cella, Harper & Scinto

[57] ABSTRACT

There is provided a data sending apparatus comprising a detecting unit to detect a transmission channel state and a coding unit for coding input information and obtaining transmission data, wherein the coding unit changes a coding processing operation in accordance with an output of the detecting unit. There is also provided a data receiving apparatus comprising a receiving unit to receive data transmitted from a communication partner, a detecting unit to detect a transmission error rate of the reception data, and a transmitting unit to transmit the transmission error rate detected by the detecting unit to the communication partner.

30 Claims, 9 Drawing Sheets

TRANSMITTING APPARATUS WITH CODE FORMATION BASED ON DETECTED TRANSMISSION CHANNEL DATA

BACKGROUND OF THE INVENTION

1. Field of the Invention

The invention relates to a data sending/receiving apparatus and, more particularly, to a data sending/receiving apparatus in a system for transmitting image data or the like by a phase modulation method.

2. Related Background Art

There is known a transmission system for variable-length encoding quantized image data in accordance with a transmission rate and phase modulating and transmitting to a transmission medium.

For instance, such a system is used in the image communication through a communication satellite.

Figure 1:
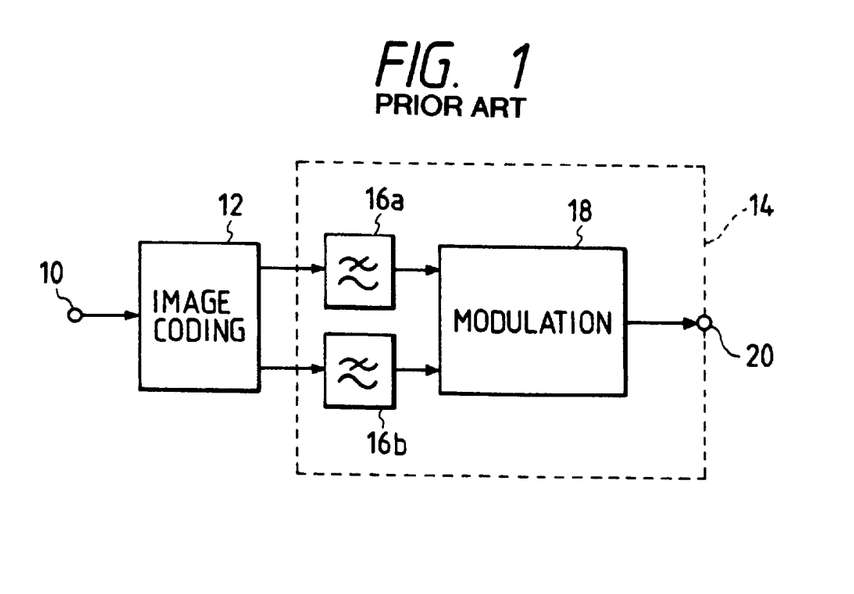
FIG. 1 is a block diagram of a conventional sending apparatus.

FIG. 1 shows a constructional block diagram on the transmission side of a conventional apparatus according to a 4-phase phase modulation method. An image signal is supplied to an input terminal 10. An image coding apparatus 12 performs a variable-length coding of the input image signal in accordance with a transmission rate and, further, adds an error correction code to the coded image signal and generates the resultant image data as two phases of P and Q. In a 4-phase phase modulation apparatus 14, an output of the image coding apparatus 12 is first filtered by roll-off filters 16a and 16b and is 4-phase phase modulated by a modulation circuit 18. The 4-phase phase modulated carrier wave is applied from an output terminal 20 to a transmission medium. A passing frequency band and a roll-off coefficient α of each of the roll-off filters 16a and 16b have been predetermined in accordance with a transmission rate, a transmission frequency occupied band, an error correcting capability, and the like.

Figure 2:
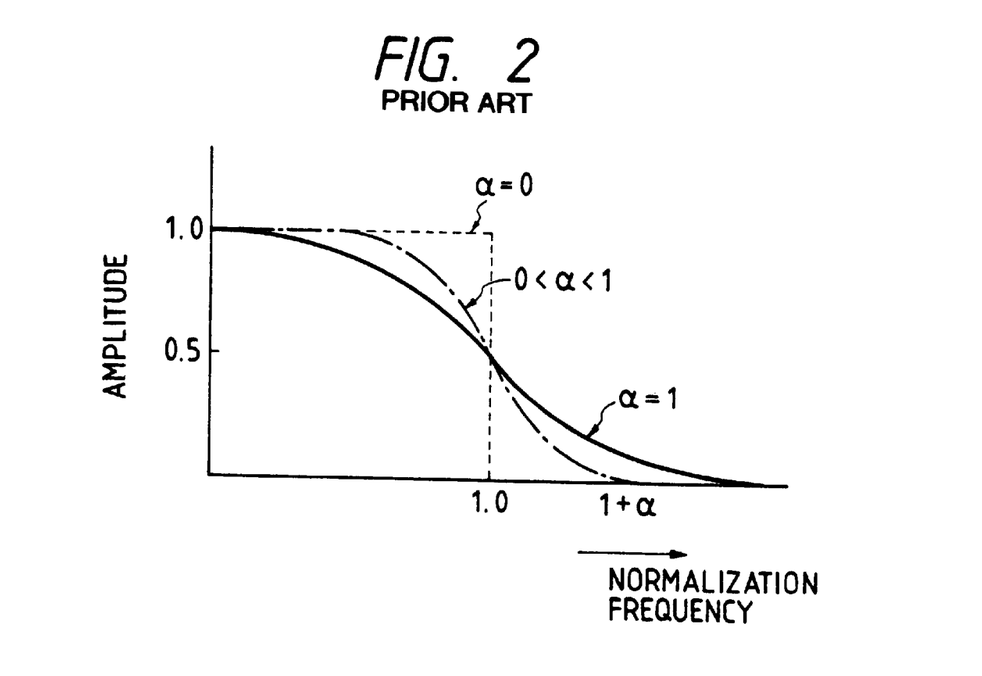
FIG. 2 is a diagram for explaining frequency characteristics of a cosine roll-off filter.

The roll-off filter is a low pass filter having cosine/roll-off characteristics which satisfy Nyquist theory to perfectly eliminate inter-code interference. FIG. 2 shows the roll-off coefficient α and amplitude frequency characteristics.

Assuming that the roll-off coefficient α is constant, it is necessary to widen a passing frequency band of the roll-off filter as the transmission rate rises. When a state of a transmission channel is bad, a decoding error rate increases with a decrease in roll-off coefficient α. On the contrary, when the coefficient α increases, the decoding error rate decreases. However, the transmission frequency occupied band is widened. That is, there is the following relation among the roll-off coefficient α, transmission rate F, and transmission frequency occupied band B.

$$B = G(\alpha) \cdot F$$

where, $G(\alpha)$ is an increasing function.

When the transmission line state deteriorates in the above transmission system, in order to suppress the increase in decoding error rate, methods of increasing the roll-off coefficient α in order to raise the error correcting capability by increasing a redundancy and the like are considered. However, those methods are not practical because a change in transmission format or a change in transmission frequency occupied band occur.

SUMMARY OF THE INVENTION

It is an object of the invention to provide a data sending/receiving apparatus which can suppress an increase in decoding error rate for a deterioration of a transmission channel state under such circumstances.

To accomplish the above object, according to a preferred embodiment of the invention, there is provided a data sending apparatus comprising detecting means for detecting a transmission channel state and coding means for coding input information and obtaining transmission data, wherein the coding means changes a coding processing operation in accordance with an output of the detecting means.

According to another preferred embodiment of the invention, there is provided a data sending/receiving apparatus comprising receiving means for receiving data transmitted from a communication partner, detecting means for detecting a transmission error rate of the reception data, and sending means for sending the transmission error rate detected by the detecting means to the communication partner.

Other objects and advantages of the invention will become apparent from the following detailed description taken in conjunction with the accompanying drawings.

DETAILED DESCRIPTION OF THE PREFERRED EMBODIMENTS

The first embodiment according to the invention will be described hereinbelow.

Figure 3:
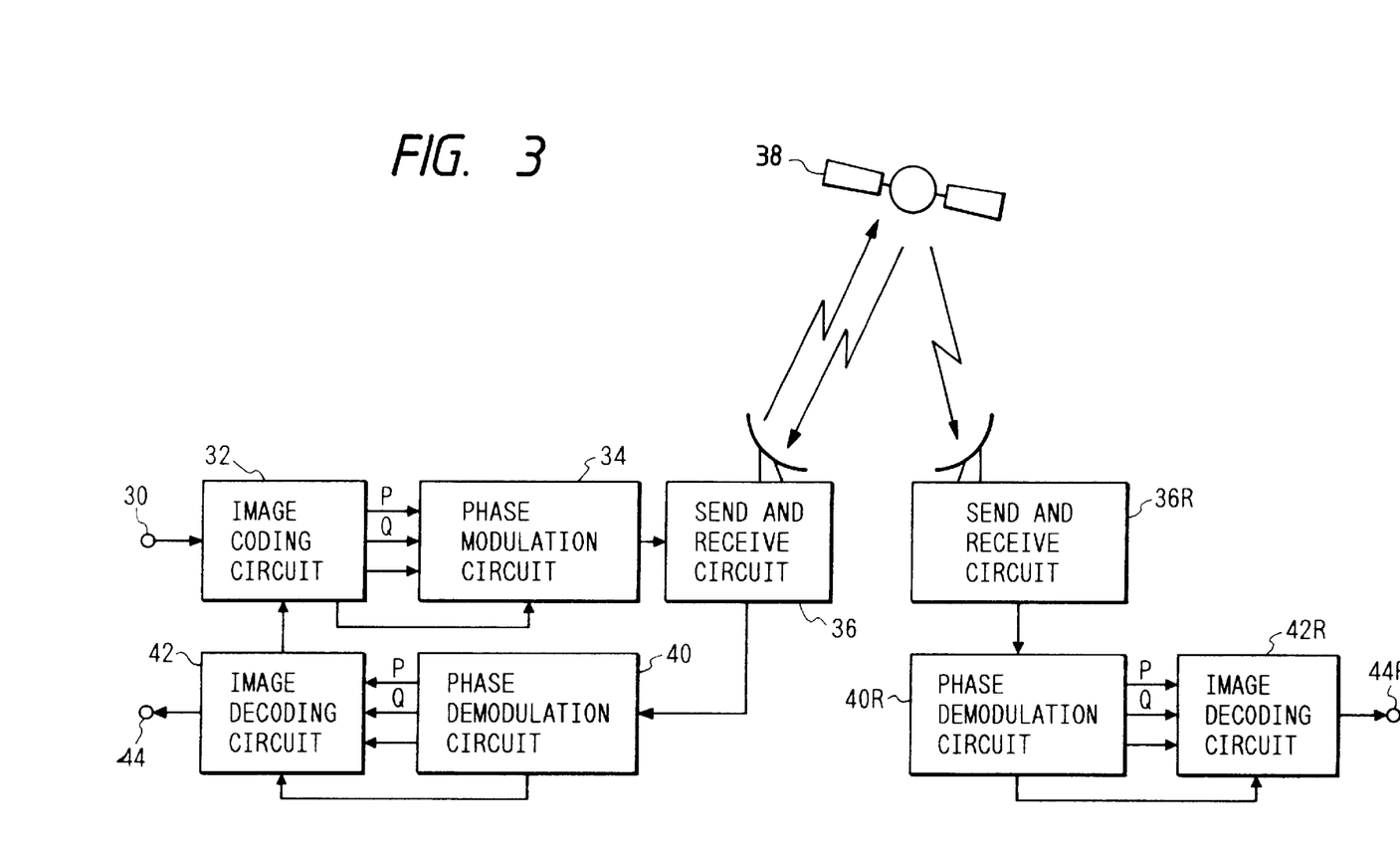
FIG. 3 is a block diagram of a data sending apparatus and a data receiving apparatus in the first embodiment according to the invention.

FIG. 3 is a fundamental constructional diagram of the first embodiment of the invention using a satellite communication channel as a transmission medium. Reference numeral 30 denotes an input terminal of an image signal to be transmitted; 32 an image coding circuit to code the image signal supplied from the input terminal 30; 34 a phase modulation circuit to phase modulate an output code of the image coding circuit 32; 36 a send and receive circuit for sending an output of the phase modulation circuit 34 to a communication satellite 38 and for receiving a signal from the communication satellite 38; 40 a phase demodulation circuit to phase demodulate the signal received by the send and receive circuit 36; 42 an image decoding circuit to decode a demodulated signal from the phase demodulation circuit 40; and 44 an output terminal of the received image signal.

Reference numerals 36R, 40R, and 42R denote a send and receive circuit, a phase demodulation circuit, and an image decoding circuit of a receiving station, respectively, and have the same circuit constructions as those of the circuits 36, 40, and 42. Reference numeral 44R denotes an output terminal of an image signal decoded by the image decoding circuit 42R.

In the embodiment, in order to check a state of the communication channel through the communication satellite 38, the signal transmitted from the send and receive circuit 36 to the communication satellite 38 is returned from the communication satellite 38 to the same send and receive circuit 36. The signal is demodulated by the phase demodulation circuit 40 and is decoded by the image decoding circuit 42. The image decoding circuit 42 supplies information of a transmission error rate to the image coding circuit 32 and phase modulation circuit 34. As will be explained in detail hereinlater, the image coding circuit 32 and the 4-phase phase modulation circuit 34 optimize the quantization characteristics and the coefficient $\alpha$ of the roll-off filter in accordance with the transmission error rate information from the image decoding circuit 42 as will be explained in detail hereinlater.

Figure 4:
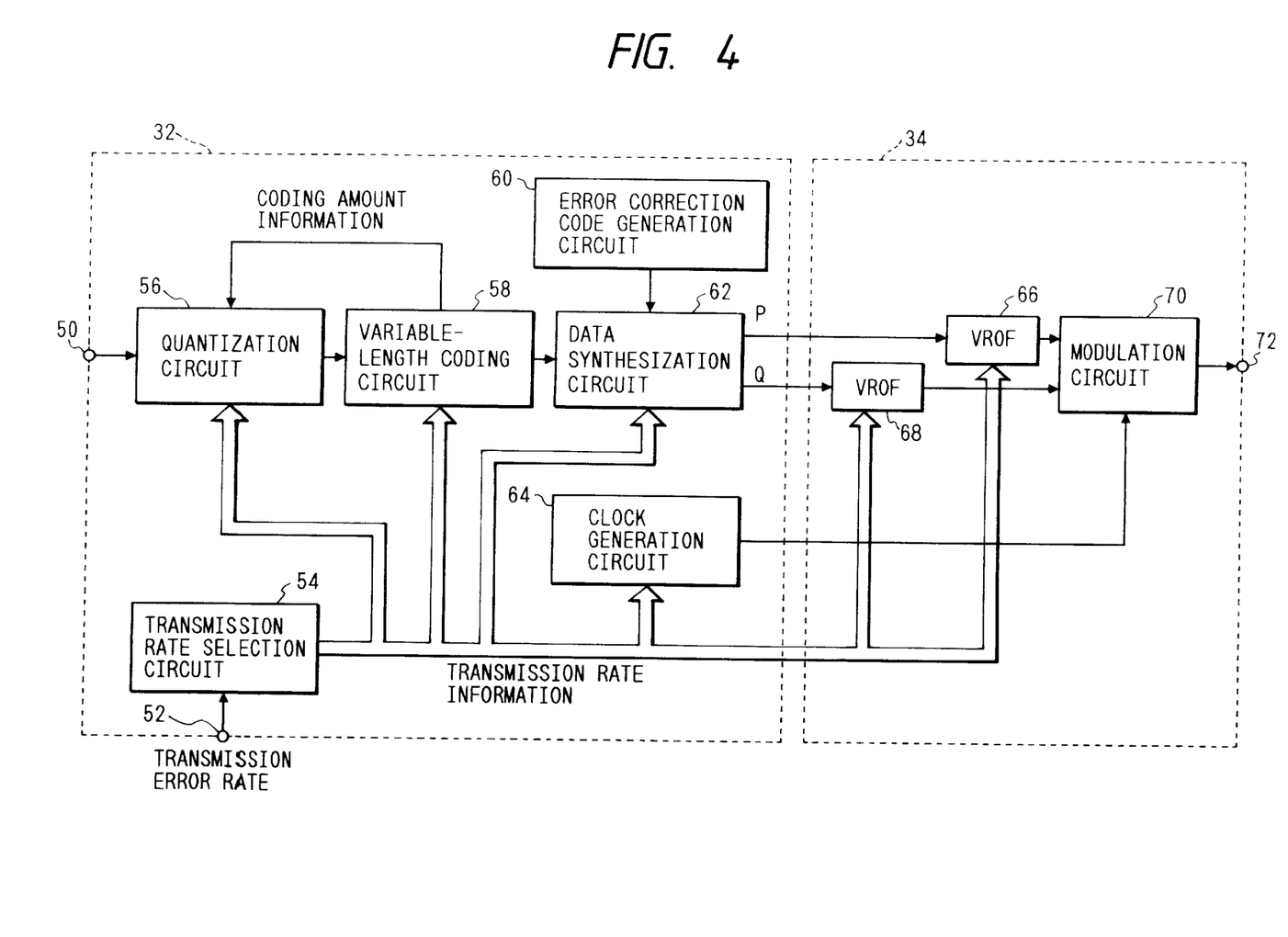
FIG. 4 is a block diagram showing a main section on the transmission side of the first embodiment.
Figure 5:
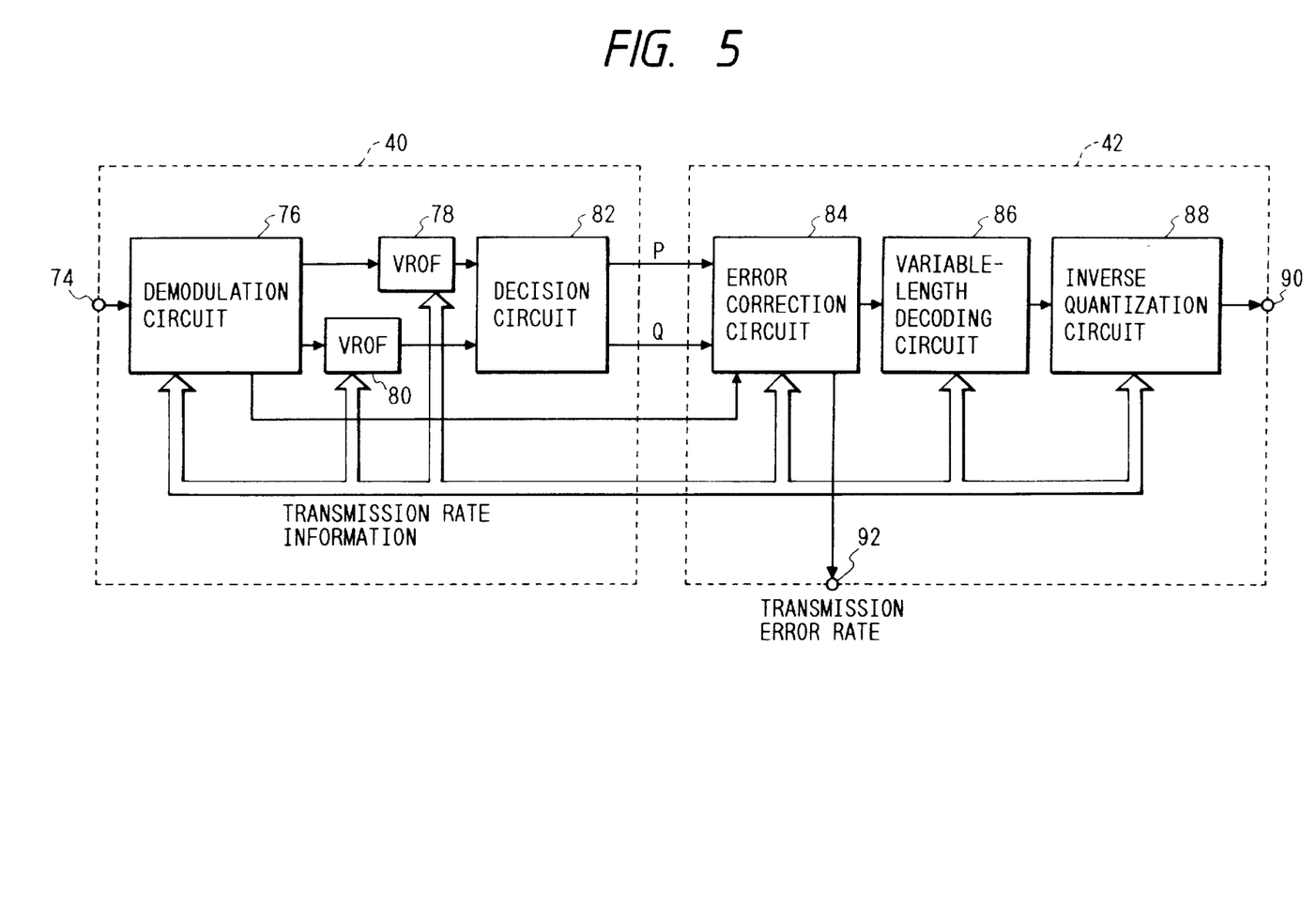
FIG. 5 is a block diagram showing a main section on the reception side of the first embodiment.

FIG. 4 shows a detailed constructional block diagram of the image coding circuit 32 and phase modulation circuit 34. FIG. 5 is a detailed constructional block diagram of the phase demodulation circuit 40 and the image decoding circuit 42.

The operation on the transmission side will be first described in detail with reference to FIG. 4. The image signal is supplied from the input terminal 30 to an input terminal 50 of the image encoding circuit 32. The transmission error rate information is supplied from the image decoding circuit 42 to an input terminal 52. A transmission rate selection circuit 54 determines a proper transmission rate in accordance with the transmission error rate information from the input terminal 52. The information regarding the determined transmission rate is supplied to a quantization circuit 56, a variable-length coding circuit 58, a data synthesization circuit 62, a clock generation circuit 64, and control terminals of variable roll-off filters 66 and 68. It will be obviously understood that when the transmission error rate information is not supplied from the input terminal 52, the transmission rate selection circuit 54 selects a predetermined value as a transmission rate.

The quantization circuit 56 quantizes the image signal from the input terminal 50. However, a quantization coefficient in this instance is determined by both of a control signal from the transmission rate selection circuit 56 and a coding information amount from the variable-length coding circuit 58 at the post stage. The variable-length coding circuit 58 variable-length codes an output of the quantization circuit 56. At the output stage of the coding circuit 58, the image signal has been coded to a predetermined information amount. An error correction code generation circuit 60 generates an error correction code for a predetermined amount of codes which are generated from the coding circuit 58. The data synthesization circuit 62 adds the error correction code from the error correction code generation circuit 60 to such a predetermined amount of output codes from the coding circuit 58 and forms a block. The data synthesization circuit 62 supplies such a block of codes to the 4-phase phase modulation circuit 34 by two phases of P and Q at a rate which is ½ of the transmission rate determined by the transmission rate selection circuit 54.

In the modulation circuit 34, the P signal is supplied to the variable roll-off filter 66 and the Q signal is supplied to the variable roll-off filter 68. Each of the variable roll-off filters 66 and 68 comprises a non-recursive digital filter or a recursive digital filter. The passing frequency band and the roll-off coefficient $\alpha$ can be changed by properly setting a filter coefficient which is obtained from both of the transmission rate information from the transmission rate selection circuit 54 and a predetermined transmission occupied frequency band. The filters 66 and 68 have been adjusted so as to obtain the optimum amplitude frequency characteristics. The P signal and Q signal are waveform shaped by the variable roll-off filters 66 and 68 and applied to a modulation circuit 70, respectively. The modulation circuit 70 modulates a carrier wave by the waveform shaped P and Q signals. The modulated wave is supplied from an output terminal 72 to the send and receive circuit 36.

The send and receive circuit 36 frequency converts the modulated wave from the 4-phase phase modulation circuit 34, namely, the modulation circuit 70, and amplifies and transmits to the communication satellite 38.

The operation on the reception side will now be described in detail with reference to FIG. 5. The send and receive circuit 36 (or 36R) receives the transmission wave from the communication satellite 38 amplifies, frequency converts and supplies the result to the 4-phase phase demodulation circuit 40 (or 40R). In FIG. 5, a reception wave is supplied from the send and receive circuit 36 (or 36R) to an input terminal 74. A demodulation circuit 76 knows a transmission rate by an internal clock reproduction circuit, 4-phase phase demodulates a signal from the input terminal 74 and also adjusts the amplitude frequency characteristics of variable roll-off filters 78 and 80 to the optimum values. Two outputs of the demodulation circuit 76 are supplied to a decision circuit 82 through the variable roll-off filters 78 and 80 and are demodulated to the P signal and Q signal, respectively.

The outputs of two phases of the demodulation circuit 40 (40R) are supplied to an error correction circuit 84 of the image decoding circuit 42 (or 42R). In accordance with transmission rate information from the demodulation circuit 76, the error correction circuit 84 corrects an error of the output of the demodulation circuit 40 and supplies the error corrected reception signal to a variable-length decoding circuit 86 and also supplies the transmission error rate information to an output terminal 92. On the transmitting station side, the transmission error rate information of the output terminal 92 is supplied from the input terminal 52 of the image coding circuit 32 to the transmission rate selection circuit 54 as described before.

In accordance with the transmission rate information from the demodulation circuit 76, the variable-length decoding circuit 86 variable-length decodes the reception signal from the error correction circuit 84. An inverse quantization circuit 88 inversely quantizes an output of the decoding circuit 86 by a quantization coefficient according to the transmission rate information from the demodulation circuit 76. That is, the variable-length decoding circuit 86 and the inverse quantization circuit 88 execute processes opposite to the coding of the variable-length coding circuit 58 and the quantization of the quantization circuit 56, respectively. By the above processes, the original image information is reconstructed and applied to the output terminal 44 through an output terminal 90.

Summarizing the above operations, in the above embodiment, when the transmission line state deteriorates, the transmission rate is reduced, the passing frequency bands of the roll-off filters of the modulation and demodulation circuits are narrowed, and the roll-off coefficients a are increased. When the transmission channel state is improved, processes opposite to the above processes are executed. In either of the above two cases, the transmission frequency occupied band remains a constant value.

The second embodiment according to the invention will now be described hereinbelow.

Figure 6:
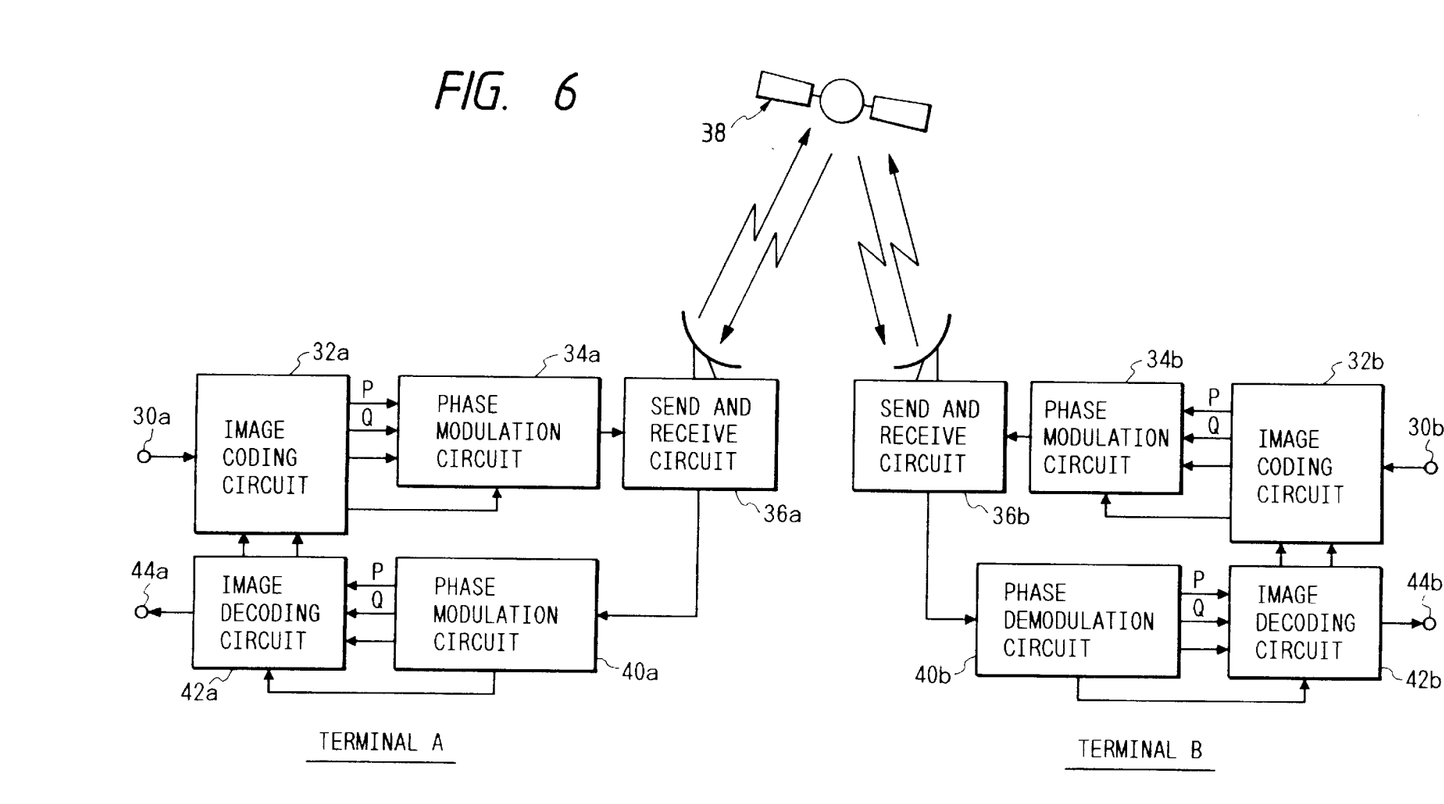
FIG. 6 is a block diagram of a data sending apparatus and a data receiving apparatus in the second embodiment according to the invention.

FIG. 6 is a fundamental constructional diagram of the second embodiment of the invention using a satellite communication channel as a transmission medium. In FIG. 6, the same component elements as those shown in FIG. 3 are designated by the same reference numerals. Two send/ reception terminals A and B having the same construction are connected by the satellite communication channel.

In the terminals A and B. reference numerals 30*a* and 30*b* denote input terminals of image signals to be transmitted; 32*a* and 32*b* image coding circuits to code the image signals from the input terminals 30*a* and 30*b*; 34*a* and 34*b* phase modulation circuits to phase modulate output codes of-the image coding circuits 32*a* and 32*b*; 36*a* and 36*b* send and receive circuits for sending outputs of the phase modulation circuits 34*a* and 34*b* to the communication satellite 38 and for receiving the signals from the communication satellite 38; 40*a* and 40*b* phase demodulated circuits to phase demodulate the signals received by the send and receive circuits 36*a* and 36*b*; 42*a* and 42*b* image decoding circuits to decode demodulated signals from the phase demodulation circuits 40*a* and 40*b*; and 44*a* and 44*b* output terminals for the image signals received.

In the second embodiment, a communication channel state of each communicating method, practically speaking, a transmission error rate is checked at a time point of the establishment of the communication channel or at a proper time point after the communication channel was established. For example, the terminal A codes and modulates the image (for instance, dummy image to check the communication channel) to be transmitted and sends the result to the terminal B through the communication satellite 38. In the terminal B, the send and receive circuit 36*b* receives the signal from the communication satellite 38, the phase demodulation circuit 40*b* demodulates the reception signal, and the image decoding circuit 42*b* decodes the demodulated signal. By the decoding in the image decoding circuit 42*b*, the terminal B can know a transmission error rate information R of the communication channel from the terminal A to the terminal B. The image decoding circuit 42*b* supplies the transmission error rate information $R_{ab}$ to the image coding circuit 32*b* and the phase modulation circuit 34*b*.

The image coding circuit 32*b* and the 4-phase phase modulation circuit 34*b* codes and modulates the image to check the communication channel state, in a manner similar to the case of the terminal A, and transmit the coded, modulated image to the terminal A together with the transmission error rate information $R_{ab}$. The terminal A can know a transmission error rate information $R_{ba}$ of the communication channel from the terminal B to the terminal A in a manner similar to the case of the terminal B which has already received the image to check the communication channel state. That is, the terminal A can know the transmission error rate information $R_{ab}$ and $R_{ba}$ at this time point. The terminal A sends the transmission error rate information $R_{ba}$ detected as mentioned above to the terminal B.

Figure 7:
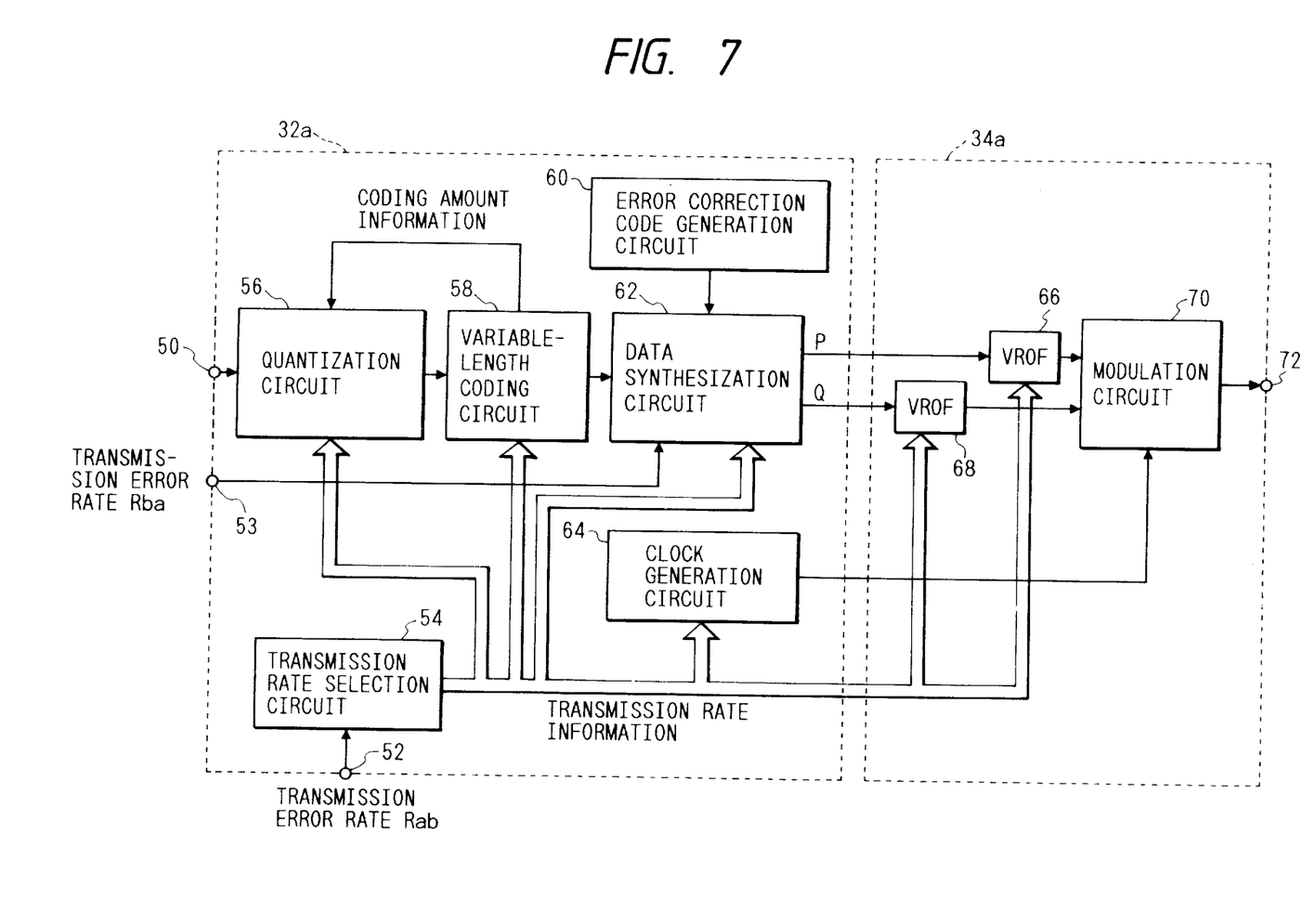
FIG. 7 is a block diagram showing a main section on the transmission side of the second embodiment.
Figure 8:
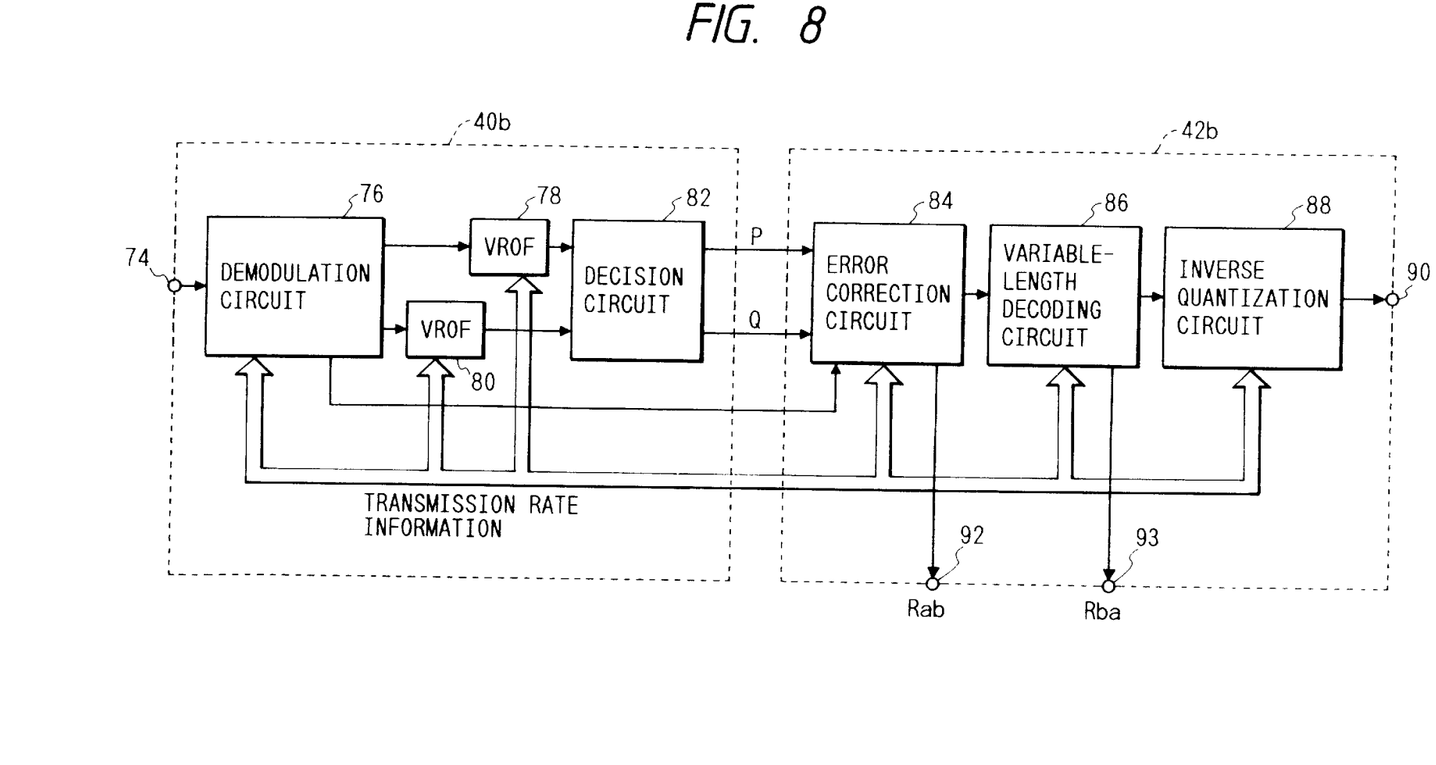
FIG. 8 is a block diagram showing a main section on the reception side of the second embodiment.

The operation in case of transmitting information from the terminal A to the terminal B will now be described in detail. FIG. 7 shows a detailed constructional block diagram of the image coding circuit 32*a* and phase modulation circuit 34*a* shown in FIG. 6. FIG. 8 shows a detailed constructional block diagram of the phase demodulation circuit 40*b* and image decoding circuit 42*b* shown in FIG. 6.

The transmitting operation in the terminal A will be first described in detail with reference to FIG. 7. In FIG. 7, the same component elements as those shown in FIG. 4 are designated by the same reference numerals. The image signal from the input terminal 30*a* is supplied to the input terminal 50 of the image coding circuit 32*a*. The transmission error rate information $R_{ab}$ and $R_{ba}$ are supplied from the image decoding circuit 42*a* to input terminals 52 and 53. The transmission rate selection circuit 54 determines a proper transmission rate in accordance with the transmission error rate information $R_{ab}$ from the input terminal 52. The information regarding the transmission rate decided is supplied to the quantization circuit 56, variable-length coding circuit 58, data synthesization circuit 62, clock generation circuit 64, and control terminals of the variable roll-off filters 66 and 68. It will be obviously understood that the transmission rate selection circuit 54 selects a predetermined value as a transmission rate when the transmission error rate information $R_{ab}$ is not supplied from the input terminal 52.

The quantization circuit 56 quantizes the image signal from the input terminal 50. However, a quantization coefficient in this instance is determined by both a control signal from the transmission rate selection circuit 54 and a coded information amount from the variable-length coding circuit 58 at the post stage. The coding circuit 58 variable-length codes the output of the quantization circuit 56. The image signal has been coded to a predetermined information amount at the output stage of the coding circuit 58. The error correction code generation circuit 60 generates an error correction code to a predetermined amount of codes which are generated from the coding circuit 58. The data synthesization circuit 62 adds the error correction code from the error correction code generation circuit 60 and the transmission error rate information $R_{ba}$ from the input terminal 53 to such a predetermined amount of output codes from the variable-length coding circuit 58, and forms a block of codes and send the block to the 4-phase phase modulation circuit 34*a* by two phases of P and Q at a rate of ½ of the transmission rate which has been determined by the transmission rate selection circuit 54.

Figure 9:
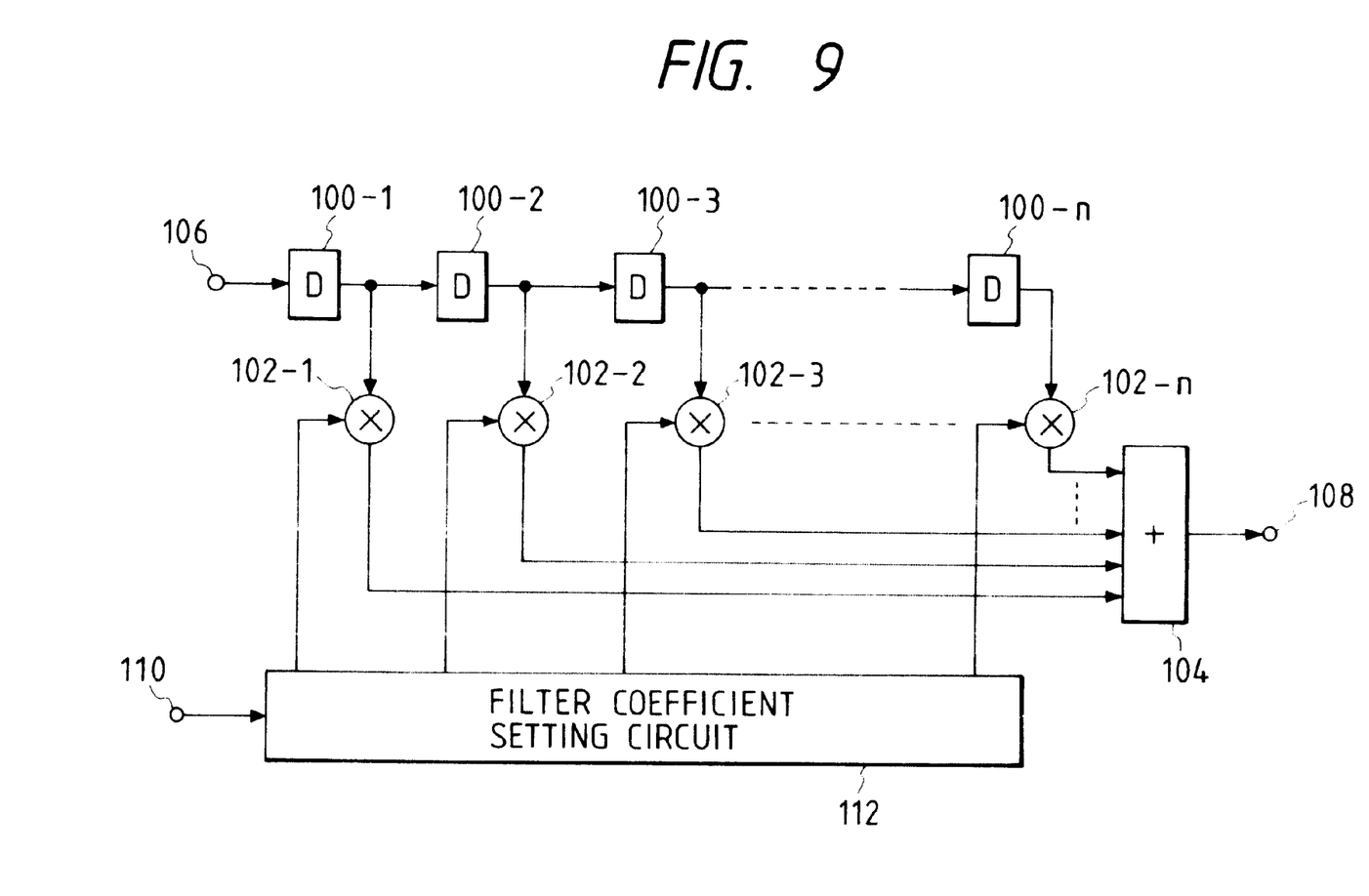
FIG. 9 is a block diagram of a variable roll-off filter.

In the 4-phase phase modulation circuit 34*a*, the P signal and Q signal are supplied to the variable roll-off filters 66 and 68. FIG. 9 shows a circuit example of the variable roll-off filters 66 and 68.

Each of the variable roll-off filters 66 and 68 shown in FIG. 9 comprises a non-recursive digital filter. The transmission rate information from the transmission rate selection circuit 54 is supplied to an input terminal 110. A filter coefficient setting circuit 112 selects and determines a filter coefficient from both of the transmission rate information from the input terminal 110 and a predetermined transmission occupied frequency band and supplies the result to multiplying circuits 102-1 to 102-*n*. The P signal or Q signal is supplied to an input terminal 106 and is sequentially delayed by delay circuits 100-1 to 100-*n* each having a predetermined delay amount. The P or Q signals delayed by the delay circuits 100-1 to 100-*n* are supplied to the multiplying circuits 102-1 to 102-*n*.

The multiplying circuits 102-1 to 102-*n* multiply the filter coefficient decided by the filter coefficient setting circuit 112 by the P or Q signals delayed by the delay circuits 100-1 to 100-n. An adding circuit 104 adds outputs of the multiplying circuits 102-1 to 102-n. An output of the adding circuit 104 is supplied from an output terminal 108 to the modulation circuit 70.

By changing the filter coefficient as mentioned above, the passing frequency band and the roll-off coefficient α can be changed, thereby adjusting so as to obtain the optimum amplitude frequency characteristics in accordance with the transmission rate.

The P and Q signals are waveform shaped by the variable roll-off filters 66 and 68 and supplied to the modulation circuit 70, respectively. The modulation circuit 70 modulates the carrier wave by the waveform shaped P and Q signals. The modulated wave is supplied from the output terminal 72 to the send and receive circuit 36a.

The send and receive circuit 36a frequency converts the modulated wave from the 4-phase phase modulation circuit 34a, namely, from the modulation circuit 70 and amplifies and sends the result to the communication satellite 38.

The receiving operation in the terminal B will now be described in detail with reference to FIG. 8. In FIG. 8, the same component elements as those shown in FIG. 5 are designated by the same reference numerals. The send and receive circuit 36b receives the transmission wave from the communication satellite 38, amplifies, frequency converts and supplies the result to the 4-phase phase demodulation circuit 40b. In FIG. 8, the reception wave from the send and receive circuit 36b is supplied to the input terminal 74. The demodulation circuit 76 knows the transmission rate by an internal clock reproduction circuit, 4-phase phase demodulates the signal from the input terminal 74 and adjusts amplitude frequency characteristics of the variable roll-off filters 78 and 80 to the optimum values by substantially the same operation as that on the transmission side. Two outputs of the demodulation circuit 76 are supplied to the decision circuit 82 through the variable roll-off filters 78 and 80 and are demodulated to the P and Q signals, respectively.

The demodulated P and Q signals are supplied to the error correction circuit 84 of the image decoding circuit 42b. The error correction circuit 84 corrects an error of the output of the demodulation circuit 40 in accordance with the transmission rate information from the demodulation circuit 76. The error corrected reception signal is supplied to the variable-length decoding circuit 86. The transmission error rate information $R_{ab}$ of the communication channel from the terminal A to the terminal B is sent to the output terminal 92. On the transmitting station side, as described above, the transmission error rate information $R_{ab}$ of the output terminal 92 is supplied to the input terminal 53 of the image coding circuit 32b and synthesized to the image information to be transmitted.

The variable-length decoding circuit 86 variable-length codes the reception signal from the error correction circuit 84 in accordance with the transmission rate information from the demodulation circuit 76 and supplies the decoded image signal to the inverse quantization circuit 88. The transmission error rate information $R_{ba}$ sent from the terminal A is supplied to an output terminal 93. The inverse quantization circuit 88 inversely quantizes an output of the variable-length decoding circuit 86 by the quantization coefficient according to the transmission rate information from the demodulation circuit 76. That is, the variable-length decoding circuit 86 and the inverse quantization circuit 88 execute processes opposite to the coding of the variable-length coding circuit 58 and the quantization of the quantization circuit 56. The original image information is reconstructed by those processes and supplied to the output terminal 44b through the output terminal 90.

Figure 10:
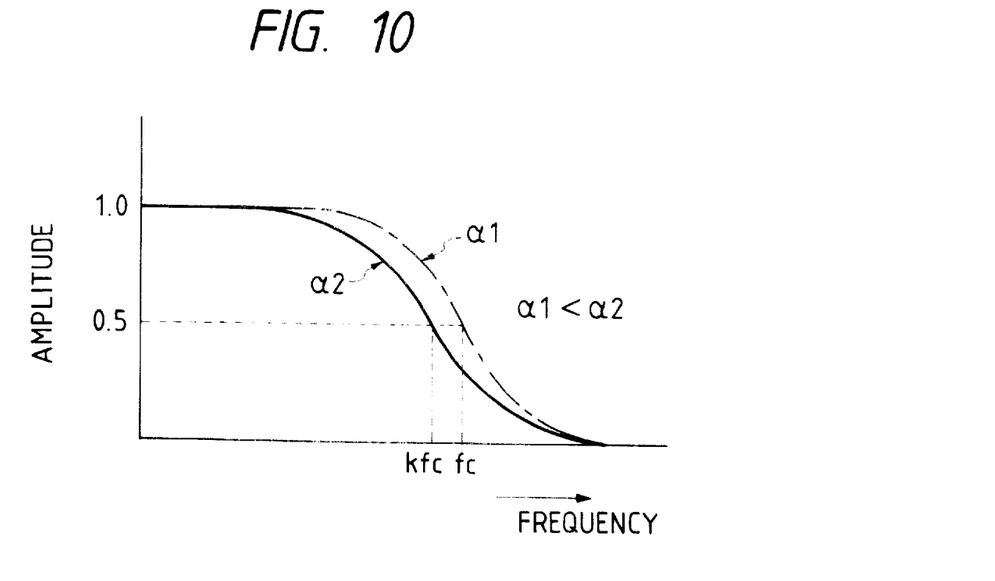
FIG. 10 is a diagram for explaining amplitude frequency characteristics of the variable roll-off filter.

The operation when the transmission channel state deteriorates will now be described. FIG. 10 shows amplitude frequency characteristics of the roll-off filter in the case where the roll-off coefficient α is increased and the passing frequency band is narrowed. When the transmission frequency occupied band B is set to a constant value and G(α) is approximated by a linear function, there is the following relation between the roll-off coefficient α and the transmission rate F.

$F=g/\alpha$ where, g is a positive constant.

Figure 11:
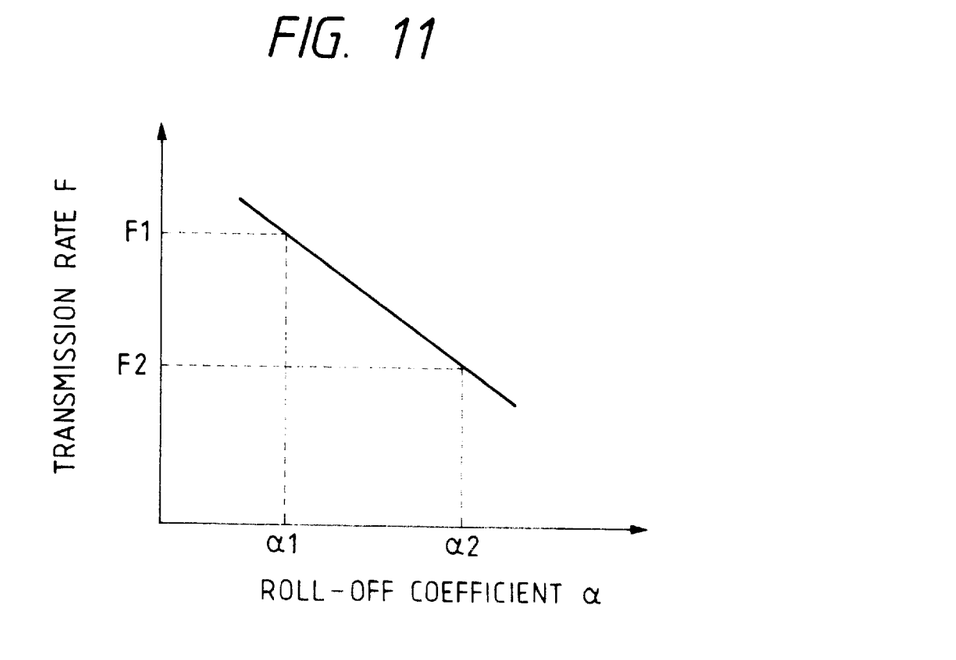
FIG. 11 is a diagram for explaining the relation between the roll-off coefficient and the transmission rate in the case where a transmission frequency occupied band is set to a constant value.

FIG. 11 shows the relation between the roll-off coefficient α and the transmission rate F by a logarithm graph.

When the transmission channel state deteriorates, in order to reduce the decoding error rate, the roll-off coefficient α of the roll-off filters of the modulation and demodulation circuits is increased from $\alpha_1$ to $\alpha_2$ ($>\alpha_1$) as shown in FIG. 10. As described above, when the roll-off coefficient α is increased, the transmission frequency occupied band B is widened. Therefore, to keep the transmission frequency occupied band B constant, the highest passing frequency of the roll-off filter is reduced from $f_c$ to $kf_c$ (where, k<1) as shown in FIG. 10, thereby decreasing the information amount. In FIG. 11, such a process corresponds to reducing the transmission rate from $F_1$ to $F_2$. The transmission rate selection circuit 54 and the filter coefficient setting circuit 112 select and set the transmission rate and filter coefficient upon deterioration of the transmission channel state under a condition such that the transmission frequency occupied band, B is held constant.

When the transmission channel state is improved, operations opposite to those mentioned above are executed.

In the above embodiment, the transmission error rate in each direction of the communication has been examined and the transmission rate has been controlled in accordance with the value of each transmission error rate. However, in the case where the state of the transmission channels can be regarded to be identical, in each direction even if the transmission rate is controlled by another direction of the basis of the measurement value of the transmission error rate in one direction, a similar effect can be obtained without causing any large error. That is, the measurement value of either one of the transmission error rate information $R_{ab}$ of the communication channel from the terminal A to the terminal B and the transmission error rate information $R_{ba}$ of the communication channel from the terminal B to the terminal A is commonly used. It is necessary that the transmission error rate information measured on the reception side is sent to the transmission side.

In each of the above embodiments, the 4-phase phase modulation has been applied. However, other phase amplitude modulating methods can be also obviously applied. A recursive digital filter can be also used as a variable roll-off filter. Further, a circuit construction such that a plurality of filters having peculiar characteristics are switched and used can be also used.

As will be easily understood from the above description, according to each of the embodiments, the transmission channel state is accurately recognized and the transmission state is changed and adjusted. Therefore, even in a transmission medium such as a satellite communication channel whose channel state is influenced by weather or the like, the stable data transmission can be always easily performed.

What is claimed is:

1. A data communication apparatus for communicating data to an external receiving apparatus through a communication path, comprising:
   a) transmitting means for transmitting communication data through the communication path;
   b) receiving means for receiving the communication data through the communication path;
   c) detecting means for detecting an error state of the communication path in accordance with the communication data received by said receiving means; and
   d) coding means for coding input information to form coded data to be transmitted,
   wherein said coding means changes a condition of a code forming processing in accordance with an output of said detecting means, and wherein the coded data is transmitted to said external receiving apparatus by using said transmitting means.

2. A data transmitting apparatus for transmitting data through a transmission channel, comprising:
   a) detecting means for detecting a transmission channel state by receiving, from another channel, transmitting data transmitted through the transmission channel; and
   b) coding means for coding input information to form coded data to be transmitted,
   wherein said coding means includes quantizing means for quantizing the input information and variable-length coding means for variable-length coding data which is generated from the quantizing means, and
   a quantization of said quantizing means is controlled in accordance with an output of said detecting means.

3. A data transmitting apparatus for transmitting coded data through a transmission path, comprising:
   a) input means for inputting error state data indicative of an error state of the coded data generated from said data transmitting apparatus after the coded data passed through the transmission path together with image data;
   b) coding means for coding input information to form the coded data to be transmitted,
   wherein said coding means changes a condition of a code forming processing in accordance with the error state data inputted by said inputting means.

4. An apparatus according to claim 3, further comprising transmission rate selecting means for determining an amount of information which is to be transmitted in a unit time in accordance with the error state data supplied from said input means.

5. An apparatus according to claim 4, wherein said coding means includes quantizing means for quantizing the input information and variable-length coding means for variable-length coding a signal which is generated from said quantizing means, and wherein a quantization step of said quantizing means is controlled in accordance with an output of said transmission rate selecting means.

6. An apparatus according to claim 3, wherein said error state data is given by an external receiving apparatus for receiving the coded data.

7. An apparatus according to claim 3, further including forming means for forming error state data indicative of an error state of the image data inputted by said inputting means.

8. A data communication apparatus for communicating data to an external receiving apparatus through a communication path, comprising:
   a) transmitting means for transmitting communication data through the communication path, wherein said transmitting means includes modulating means;
   b) receiving means for receiving the communication data through the communication path;
   c) detecting means for detecting an error state of the communication path in accordance with the communication data received by said receiving means; and
   d) control means for controlling said transmitting means, wherein said control means controls a condition of a modulation processing of said modulation means in accordance with an output of said detecting means,
   wherein said transmitting means transmits information data to said external receiving apparatus under the condition of the modulation processing controlled by said control means.

9. An apparatus according to claim 8, wherein said modulating means generates a modulated frequency band irrespective of the communication path state.

10. A data transmitting apparatus for transmitting coded data through a transmission path, comprising:
    a) input means for inputting error state data indicative of an error state of the coded data generated from said data transmitting apparatus after it passed through the transmission path together with image data; and
    b) modulating means for modulating coded data to be transmitted,
    wherein said modulating means changes a condition of a modulation processing in accordance with an output of said input means.

11. An apparatus according to claim 10, wherein said modulating means includes transmission speed selecting means for determining an amount of information which is to be transmitted in a unit time in accordance with the error state data supplied from said input means.

12. An apparatus according to claim 10, wherein said error state data is given by an external receiving apparatus for receiving the coded data.

13. An apparatus according to claim 10, further including forming means for forming error state data indicative of an error state of the image data inputted by said inputting means.

14. A data transmitting and receiving apparatus for communicating with a remote transmitting and receiving apparatus, comprising:
    a) receiving means for receiving data transmitted from said remote transmitting and receiving apparatus;
    b) detecting means for detecting a transmission error state of data received by said receiving means; and
    c) transmitting means for transmitting image data to be transmitted to said remote transmitting and receiving apparatus, said transmitting means adding error data indicating the transmitting error state detected by said detecting means to said image data and transmitting the added data.

15. An apparatus according to claim 14, wherein said added error data is used to control an amount of information which is transmitted in a unit time from the remote transmitting and receiving apparatus side.

16. A data transmitting and receiving apparatus for communicating with a remote transmitting and receiving apparatus by transmitting or receiving coded data to which an error correction code is added, comprising:
    detecting means for detecting an error state of the coded data received from said remote transmitting and receiving apparatus by using the error correction code; and
    transmitting means for transmitting image data to be transmitted to said remote transmitting and receiving apparatus, said transmitting means adding error data indicating the error state detected by said detecting means to said image data and transmitting the added data.

17. A data transmitting and receiving apparatus for communicating data through a transmission channel, comprising:
   a) receiving means for receiving image data and error data indicating a detected transmission error state of the transmission channel, the image data and the error data being included in the same transmission block which is transmitted through the transmission channel; and
   b) determining means for determining a data amount of the data to be transmitted per unit time, on the basis of the error data.

18. An apparatus according to claim 17, further comprising:
   input means for inputting image data;
   coding means for inputting image data input by said input means; and
   transmission means for transmitting the image data coded by said coding means through the transmission channel.

19. An apparatus according to claim 18, wherein said coding means changes a condition of a code forming processing in accordance with an output of said determining means.

20. An apparatus according to claim 18, wherein said transmission means includes modulation means for modulating the image data coded by said coding means, said modulating means changing a condition of a modulation processing in accordance with an output of said determining means.

21. An apparatus according to claim 20, wherein said modulating means includes a filter and characteristics of said filter are changed in accordance with an output of said determining means.

22. A data transmitting and receiving apparatus for transmitting data through a transmission channel comprising:
   a) input means for inputting image data;
   b) coding means for coding image data input by said input means;
   c) transmission means for transmitting the image data coded by said coding means through the transmission channel;
   d) receiving means for receiving image data and error data indicating a detected transmission error state of the transmission channel; and
   e) determining means for determining a data amount of the data to be transmitted per unit time on the basis of the error data,
   wherein said coding means includes quantization means for quantizing the image data input by said input means, a quantization step of said quantization means being controlled in accordance with an output of said determining means.

23. A data communication method of communication data to an external receiving apparatus through a communication path, said data communicating method to be executed in one apparatus, said method comprising:
   a) a transmitting step of transmitting communication data through the communication path by using a transmitter;
   b) a receiving step of receiving the communication data through the communication path;
   c) a detecting step of detecting an error state of the communication path in accordance with communication data received in said receiving step; and
   d) a coding step of coding input information to form coded data to be transmitted,
   wherein said coding step changes a condition of a code forming processing in accordance with a result of said detecting step, and wherein the coded data is transmitted to said external receiving apparatus by using said transmitter.

24. A data transmitting method of transmitting coded data through a transmission path, comprising:
   a) an input step of inputting error state data indicative of an error state of the coded data generated by said data transmitting method after the coded data passed through the transmission path together with image data;
   b) a coding step of coding input information to form the coded data to be transmitted,
   wherein said coding step changes a condition of a code forming processing in accordance with the error state data inputted in said inputting step.

25. A data communication method of communicating data to an external receiving apparatus through a communication path comprising:
   a) a transmitting step of transmitting communication data through the communication path by using a transmitter, wherein said transmitting step includes a modulating step;
   b) a receiving step of receiving the communication data through the communication path;
   c) a detecting step of detecting an error state of the communication path in accordance with the communication data received in said receiving step; and
   d) a control step of controlling a condition of a modulation processing of said modulating step in accordance with a result of said detecting step,
   wherein said transmitter transmits communication data to said external receiving apparatus under the condition of the modulation processing controlled in said control step.

26. A data transmitting method of transmitting coded data through a transmission path, comprising:
   a) an input step of inputting error state data indicative of an error state of the coded data generated by said data transmitting method after it passed through the transmission path together with image data; and
   b) a modulating step of modulating coded data to be transmitted,
   wherein said modulating step changes a condition of a modulation processing in accordance with an output of said input step.

27. A data transmitting and receiving method of communicating with a remote transmitting and receiving apparatus, comprising:
   a) a receiving step of receiving data transmitted from said remote transmitting and receiving apparatus;
   b) a detecting step of detecting a transmission error state of data received in said receiving step; and
   c) a transmitting step of transmitting image data to be transmitted to said remote transmitting and receiving apparatus, said transmitting step adding error data indicating the transmitting error state detected in said detecting step to said image data and transmitting the added data.

28. A data transmitting and receiving method of communicating with a remote transmitting and receiving apparatus by transmitting or receiving coded data to which an error correction code is added, comprising:

a detecting step of detecting an error state of the coded data received from said remote transmitting and receiving apparatus by using the error correction code; and a transmitting step of transmitting image data to be transmitted to said remote transmitting and receiving apparatus, said transmitting step adding error data indicating the error state detected in said detecting step to said image data and transmitting the added data.

29. A data transmitting and receiving method of communicating data through a transmission channel, comprising:

a) a receiving step of receiving image data and error data indicating a detected transmission error state of the transmission channel, the image data and the error data being included in the same transmission block which is transmitted through the transmission channel; and b) a determining step of determining a data amount of the data to be transmitted per unit time, on the basis of the error data.

30. A data transmitting and receiving method of transmitting data through a transmission channel comprising:

a) an input step of inputting image data;

b) a coding step of coding image data input in said input step;

c) a transmission step of transmitting the image data coded in said coding step through the transmission channel;

d) a receiving step of receiving image data and error data indicating a detected transmission error state of the transmission channel; and e) a determining step of determining a data amount of the data to be transmitted per unit time on the basis of the error data, wherein said coding step includes a step of quantizing the image data input in said input step, with a quantization step size controlled in accordance with an output of said determining step.

* * * * *

UNITED STATES PATENT AND TRADEMARK OFFICE
CERTIFICATE OF CORRECTION

PATENT NO.    : 6,167,539
DATED         : December 26, 2000
INVENTOR(S)   : Hiroshi Takizawa It is certified that error appears in the above-identified patent and that said Letters Patent is hereby corrected as shown below:

<u>Title page, Item [54] and Column 1, line 1,</u>
"TRANSMITTING" should read -- DATA TRANSMITTING --.

<u>Column 3,</u>
Line 60, "for" should read --- of --.

<u>Column 5,</u>
Line 2, "line" should read -- channel --.

<u>Column 6,</u>
Line 43, "send" should read -- sends --

Signed and Sealed this

Eleventh Day of June, 2002

*Attest:*

*Attesting Officer*

JAMES E. ROGAN
*Director of the United States Patent and Trademark Office*